US009385300B2

(12) United States Patent
Bright et al.

(10) Patent No.: US 9,385,300 B2
(45) Date of Patent: Jul. 5, 2016

(54) MAGNETOSTRICTIVE ACTUATOR

(71) Applicant: GREAT PLAINS DIESEL TECHNOLOGIES, L.C., Ames, IA (US)

(72) Inventors: Charles B. Bright, Ames, IA (US); Russell Bosch, Holley, NY (US)

(73) Assignee: GREAT PLAINS DIESEL TECHNOLOGIES, L.C., Ames, IA (US)

(*) Notice: Subject to any disclaimer, the term of this patent is extended or adjusted under 35 U.S.C. 154(b) by 60 days.

(21) Appl. No.: 14/174,560

(22) Filed: Feb. 6, 2014

(65) Prior Publication Data

US 2014/0217932 A1    Aug. 7, 2014

Related U.S. Application Data

(60) Provisional application No. 61/761,441, filed on Feb. 6, 2013.

(51) Int. Cl.
| | | |
|---|---|---|
| *H01L 41/12* | (2006.01) | |
| *F02M 51/06* | (2006.01) | |
| *H01L 41/18* | (2006.01) | |

(52) U.S. Cl.
CPC ............ *H01L 41/12* (2013.01); *F02M 51/0614* (2013.01); *H01L 41/18* (2013.01)

(58) Field of Classification Search
USPC .......................................... 310/26
See application file for complete search history.

(56) References Cited

U.S. PATENT DOCUMENTS

| | | | |
|---|---|---|---|
| 4,022,166 A | | 5/1977 | Bart |
| 4,175,587 A | | 11/1979 | Chadwick et al. |
| 4,959,567 A | * | 9/1990 | Ealey et al. ............ 310/26 |
| 5,031,841 A | | 7/1991 | Schafer |
| 5,251,871 A | | 10/1993 | Suzuki |
| 5,280,773 A | | 1/1994 | Henkel |
| 5,697,554 A | | 12/1997 | Auwaerter et al. |
| 5,739,600 A | * | 4/1998 | Kobayashi et al. ....... 310/26 |
| 5,779,149 A | | 7/1998 | Hayes, Jr. |

(Continued)

FOREIGN PATENT DOCUMENTS

GB       837279 A  *  6/1960  ............. H01L 41/12

OTHER PUBLICATIONS

Bright, Charles B. et al., Programmable Diesel Injector Transducer Test Results; SAE Technical Paper No. 2001-01-0381, 8 pages, Apr. 12, 2011.

(Continued)

*Primary Examiner* — Burton Mullins
(74) *Attorney, Agent, or Firm* — McKee, Voorhees & Sease, PLC

(57) ABSTRACT

A method of minimizing the cold start delay and impact fatigue of an actuator includes calibrating the actuator by initially raising the temperature to a desired operating temperature through induction heating of the actuator rod. Additionally, a control system for a magnetostrictive actuator includes a rod of magnetostrictive material, a solenoid coil wrapped at least once around said rod, and a controller operatively connected to said solenoid coil wherein the controller detects an impact of the rod with another surface and adjusts the operation of the actuator to minimize the potential for additional future impacts. The rod may be segmented and include end caps to further reduce the potential for impact fatigue.

10 Claims, 6 Drawing Sheets

(56) References Cited

U.S. PATENT DOCUMENTS

| | | |
|---|---|---|
| 5,810,255 A | 9/1998 | Itoh et al. |
| 5,860,597 A | 1/1999 | Tarr |
| 5,875,632 A | 3/1999 | Kappel et al. |
| 5,875,764 A | 3/1999 | Kappel et al. |
| 5,979,803 A | 11/1999 | Peters et al. |
| 6,079,636 A | 6/2000 | Rembold et al. |
| 6,246,132 B1 * | 6/2001 | Joshi et al. .................. 310/26 |
| 6,253,736 B1 | 7/2001 | Crofts et al. |
| 6,307,286 B1 | 10/2001 | Yamazaki et al. |
| 6,499,467 B1 | 12/2002 | Morris et al. |
| 6,526,864 B2 | 3/2003 | Lindler et al. |
| 6,557,776 B2 | 5/2003 | Carroll, III et al. |
| 6,568,602 B1 | 5/2003 | Bram et al. |
| 6,570,474 B2 | 5/2003 | Czimmek |
| 6,577,776 B1 | 6/2003 | Hatalsky |
| 6,637,675 B2 | 10/2003 | Carroll, III et al. |
| 6,758,409 B1 | 7/2004 | Itoh |
| 6,837,221 B2 | 1/2005 | Crofts et al. |
| 6,978,770 B2 | 12/2005 | Rauznitz et al. |
| 7,059,295 B2 | 6/2006 | Blessing et al. |
| 7,077,377 B2 | 7/2006 | Schurz |
| 7,140,353 B1 | 11/2006 | Rauznitz et al. |
| 7,159,799 B2 | 1/2007 | Cooke |
| 7,196,437 B2 | 3/2007 | Mori |
| 7,255,290 B2 | 8/2007 | Bright et al. |
| 7,262,543 B2 | 8/2007 | Moses et al. |
| 7,334,741 B2 | 2/2008 | Benson et al. |
| 7,422,166 B2 | 9/2008 | Hoffmann et al. |
| 7,500,648 B2 | 3/2009 | Kammerer et al. |
| 7,891,585 B2 * | 2/2011 | Tsuchiya et al. ........ 239/585.5 |
| 8,113,179 B1 | 2/2012 | Bright |
| 8,418,676 B2 | 4/2013 | Bright |
| 2002/0057156 A1 | 5/2002 | Czimmek |
| 2004/0103885 A1 | 6/2004 | VanWeelden et al. |
| 2005/0274820 A1 | 12/2005 | Bright et al. |
| 2007/0007363 A1 | 1/2007 | Mifuji et al. |

OTHER PUBLICATIONS

Cain, Markys G. et al., Degradation of Piezoelectric Materials; NPL Report CMMT(A) 148, 39 pages; Jan. 1999.

Carnot, Sadi, "Reflections on the Motive Power of Fire" book, Dover Publications, pp. 1-151, 1998.

Chowdhury, H.A., "A Finite Element Approach for the Implementation of Magnetostrictive Material Therfenol-D in Automotive CNG Fuel Injection Actuation", DCU Thesis, M.Eng. 167 pages, Jul. 2008.

Dapino, M.J. et al., "Magnetostrictive Devices", Wiley Encyclopedia of Electrical & Electronics Engineering, ISBN-13-9780471390527, p. 278-308, 1999.

Department of Defense, Military Standard, "Piezoelectric Ceramic Matieral and Measurements Guidelines for Sonar Transducers" MIL-STD-1376B Handbook, Feb. 24, 1995.

Diesel, Rudolf, Diesel's Rational Heat Motor: A Lecture (1897), Progressive Age Publishing Co., Book, pp. 1-31, 1897.

Diesel, Rudolf Theory and Construction of a Rational Heat Motor: Bibliolife Book, pp. 1-85, 1984.

Ganser, M. A., "Common Rail Injector with Injection Rate Control" SAE Technical Paper Series 981927, Aug. 11-13, 1998 Future Transportaiton Technology Conference & Exposition, 8 pages.

Faidley, LeAnn E., et al. "Terfenol-D elasto-magnetic properties under varied operating conditions using hysteresis loop analysis" SPIE vol. 3329, SPIE Conferance on Smart Structures and Integrated Systems, Mar. 1998, pp. 856-865.

* cited by examiner

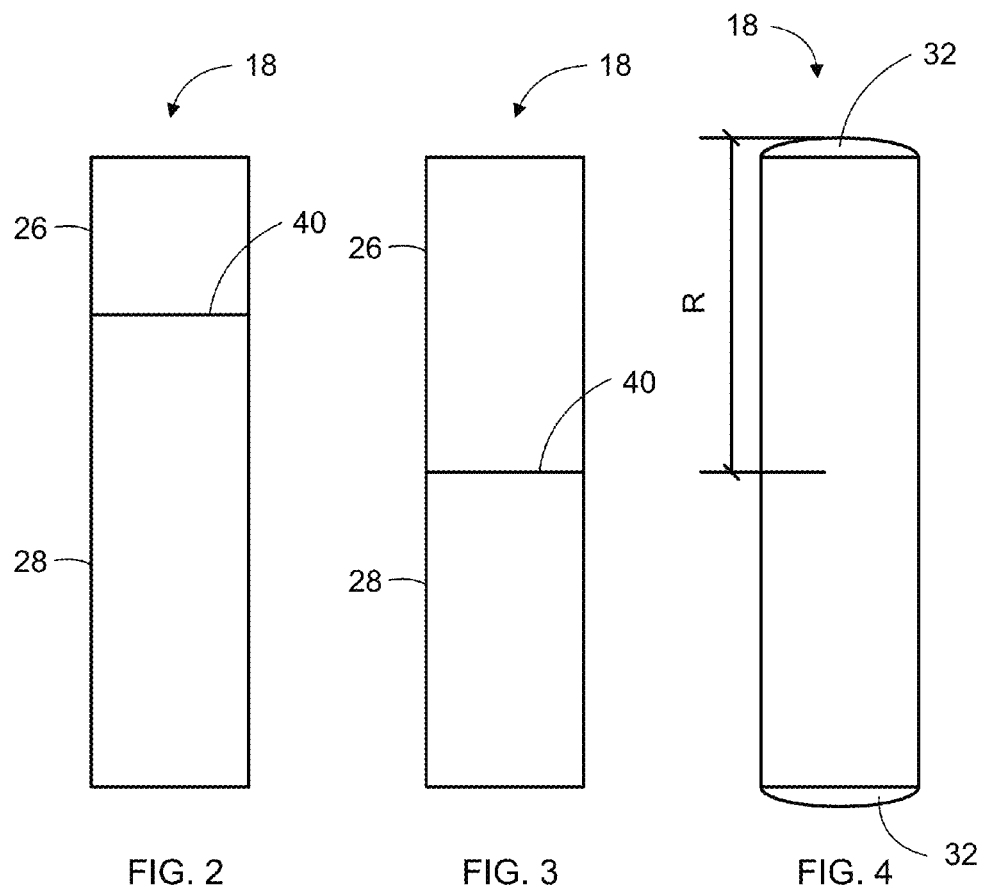

Absolute magnetostrictive strain
with respect to magnetic field.

Actuator voltage, current, and displacement with respect to time.

MAGNETOSTRICTIVE ACTUATOR

CROSS-REFERENCE TO RELATED APPLICATIONS

This application claims priority under 35 U.S.C. §119 to provisional application Ser. No. 61/761,441 filed Feb. 6, 2013, herein incorporated by reference in its entirety.

BACKGROUND OF THE INVENTION

The following discussion is intended for explanatory purposes only and is not to be considered an admission any of the information is legal "prior art." In the work and development of the magnetostrictive actuator for use in a programmable diesel fuel injector in accordance with U.S. Pat. Nos. 7,255,290, 8,113,179, and 8,418,676, all of which are incorporated in their entirety herein, additional opportunities to improve upon the actuators have also been identified.

Looking first at the example where an actuator is used in a diesel fuel injector, it is understood that pollutant formation is controlled by combustion complexities. Before the fuel burns, certain physical and chemical processes must occur to prepare the mixture of air and fuel vapor. Much technical literature and many patents disclose that metering very quick jets or pulses of standard number two liquid petroleum diesel fuel helps to reduce pollutants. Injecting a fuel volume of order one cubic millimeter prior to a main charge injection is advantageous in suppressing pollutant formation. As used here, "prior to a main charge injection" means that the time delay between the small and main charges should be as short as possible.

A preferred actuator within the fuel injector exhibits the highest possible speed, control of that speed, and minimum delay as needed between pulses. For certain conditions, more than one small charge may be further advantageous. This performance combination has been difficult to achieve in practice because actuator technology lagged. Much creative and ingenious innovation has gone into improving control over diesel fuel injection. Ultimately, these efforts are limited by the physics of the two main electrical control technologies used to date: solenoids and piezo-electric ceramics, hereinafter piezo. Solenoid injectors date at least as far back as Gaff in 1913 while piezo injectors date at least from Bart in 1977. Thus, both solenoids and piezo have had the benefit of sustained attention to their limitations. Well into the piezo injector era, Benson et al in 2008 show that piezo has yet to fully replace solenoid technology.

Solenoids offer durability, but are unsuitable for continuous control. Their key characteristic is that the mechanical motion can never be proportional to electrical input. While durable and reliable, precise actuator control remains elusive and thus neither intelligible speech nor ideal fuel rate shapes nor quick jets with minimal delay can be reproduced by the solenoid. By its operating principle, when a magnetic flux above a threshold value crosses an air gap, its two poles accelerate toward each other, closing the gap until, eventually, they impact each other and, depending on design details, bounce back. The force that accelerates the two poles is inversely proportional to the square of the gap between them, making velocity or position control difficult. Thus, the solenoid is either open, closed, bouncing, or transitioning between these states at a more or less uncontrollable rate.

Piezos offer speed and infinitely adjustable displacement within their range, permitting continuous control. The key feature of this technology is that mechanical expansion is proportional to applied voltage, within limits. Piezo force and displacement are akin to thermal expansion except electrically controllable and much, much faster. Piezos can be used to reproduce intelligible speech or to rate shape injected fuel, but only for a while. Their inherent critical defect is susceptibility to performance degradation as noted in U.S. Pat. Nos. 5,875,764, 7,159,799, and 7,262,543, MIL-STD-1376, and Cain et al, among many references. This degradation or aging is the Achilles heel of piezo technology, disabling its use in a durable, continuously controllable, fast diesel injector. When lightly loaded to get reasonable life, piezos can offer a telegraph-style ON-OFF speed improvement over solenoids, enabling the faster and smaller multiple pulse injections in use to reduce in-cylinder formation of diesel emissions. Despite its speed and proportionality, limiting piezo to telegraph-like behavior to get a reasonable working life makes this approach less than ideal for rate shaping fuel injection.

The piezoelectric ceramic must be "poled" to operate. In context here, expansion requires an electrical input of only one polarity. If a reverse voltage of the same magnitude were applied to the piezoelectric ceramic, it is likely to be rendered inoperable by depoling. The forward voltage cannot exceed a threshold. There is thus a need for an actuator that is both durable and offers continuous control.

The US Navy developed an intermetallic alloy of iron and the rare earths terbium and dysprosium for sonar—it is the magnetostrictive equivalent of piezoelectric ceramics. The alloy couples a magnetic input to a mechanical output. It offers speed, infinitely adjustable displacement within its range, and the durability to survive on an engine cylinder head. The key feature of this technology is that mechanical expansion is proportional to the current sheet circulating around it, regardless of circulation direction. Magnetostrictive displacement and force are akin to thermal expansion except magnetically controllable and much, much faster as noted in Dapino et al and Faidley et al. A magnetostrictive actuator employing this alloy can reproduce intelligible speech or adaptably and quickly rate shape injected fuel without a durability limit.

The quantum mechanical origin of the magnetostrictive effect in the rare earth/transition metal alloy guarantees the survival of the effect itself. The effect does not fatigue. Alloy constituent proportions control the magnitude of the effect with respect to temperature, where the effect diminishes as temperature rises but returns fully as temperature falls. High field does not degrade the alloy. Thus, there is a need to address the use of such mangetostrictive materials at cold temperatures, such as those typically experienced by diesel trucks traveling throughout the continental United States.

The energy density of the magnetostrictive alloy is its source of high speed and force capabilities. These key characteristics are packaged into an alloy which also has additional limitations. In particular, the actuator can fracture its magnetostrictive rod under certain circumstances. For example, the high speed and high force of the actuator can accelerate its mechanical load. Depending on the details of a design, its fabrication, and its operation, after the initial acceleration the rod may decelerate faster than its load causing a gap to appear. The load will eventually close that gap and re-establish contact with the rod. However, that may be by impact, with the attendant shock reloading of the rod.

Impact shock can cause rod fracture. The likelihood of fracture is affected by impact magnitude, foreign matter between impacting surfaces, misalignment between impacting surfaces, and gap width between the impacting surfaces. The magnetostrictive effect itself, being of quantum mechanical origin, is unaffected by impact or fracture. In other words, the rod will continue to function to some degree.

Another circumstance that can cause impact shock is the presence of an obstacle within the range of the actuator's displacement. Depending on the speed at which it occurs, contact with the obstacle may cause impact shock. There is thus a need to address and attempt to minimize the tendency of both impact and potential fracture to enable employment of the full speed and power of this actuator.

Further, if periodic excitation, such as multipulse fuel injections, coincides with the natural frequency of the actuator, a standing wave will develop within the magnetostrictive rod. The standing wave is comprised of two separate elastic waves, traveling in opposite directions and superposed onto each other. The speed at which the elastic wave travels is determined by the alloy density and by its elastic modulus. The waves reflect at the rod end discontinuities. The standing wave causes a geometric location within the rod to experience the highest tensile stress within the entire rod, which could also fracture the rod. There is thus a need to widen the actuator operating range without exceeding its rod tensile limit.

Additionally, precision fuel injection requires fine control, which in turn requires calibration. For continued good fuel economy and low emissions, the continuously variable actuator and injector must always operate precisely. Overall precision of a diesel injector is affected by many influences. Machining tolerances must fit in a range yet be economical to fabricate. The continuously variable actuator must move from one precisely known location to another precisely known location in a precise amount of time. Impact of solid components causes fatigue cracking, fretting wear, and undesirable dynamics. Depending on the design, mechanism wear may thus occur, particularly with frequent and consistent impacts between the rod and other components.

Thus, it is important to know when an impact occurs. That is, it is desirable to know how long an electrical pulse can be applied to the magnetostrictive actuator. This time will drift within an individual actuator due to component wear and change in external influences. This time will also vary between individual actuators due to fabrication differences. Thus, it is desired that a displacement calibration reference be obtained from the actuator during its life cycle to further minimize the potential for fracture of the rod and damage or wear to other components of the system.

SUMMARY OF THE INVENTION

Therefore, it is an object of the present invention to address the needs discussed above and attempt to take full advantage of the inherent properties of the alloy, particularly its speed and continuous control properties.

It is another object of the present invention to mechanically toughen the actuator without sacrificing either its high speed or high force capabilities.

It is a further object of the present invention to provide a control system and method that calibrates the amount and manner of current or voltage applied to the solenoid.

These and other objects, features or advantages of the present invention will become apparent from the specification and claims.

Initially, the objects of the present invention are met in part by calibrating the system. In the diesel fuel injector example, the actuator can be calibrated before or even while the engine is operating. Initially, it is desirable to have the system ready for use with minimal operational readiness time delay. One of the key characteristics of the alloy, positive strain regardless of magnetic field polarity, can be used to minimize the time delay. Thus, a reverse voltage can be applied to the energizing coil of a magnetostrictive actuator to reverse current and quickly re-expand the alloy if necessary. Further, the temperature of the rod can be calibrated or raised above a minimum threshold to ensure operability in cold temperatures. One of the key characteristics of the alloy is that it is also an electrical conductor. As is well known, the time rate of change of a magnetic field across an electrical conductor causes currents, dubbed eddy currents, to curl around that changing field. Therefore, a direct method of heating the alloy is to cause it to resist internal eddy currents by supplying alternating current to the solenoid. Thus, the temperature of the rod can be calibrated for use in the rods desired temperature range even when external conditions are below a desired operating range.

The rods can also be calibrated to address other needs discussed above. For example, due to coupling between electromagnetic and mechanical effects, impact can be detected by observing distortion in the electrical input signal. The actuator is a symmetric, reciprocal device in that a mechanical input generates an electrical output. Therefore, the maximum time at which any particular level of electrical input can be made can be found in operation by detecting the electrical feedback effect of mechanical impact. A sudden change in the slopes of current, voltage, or both will occur at impact, suggesting that either or both can be used to calibrate the individual actuator system. For example, when an impact is detected, the current or voltage or time rate of change of the current or voltage can be adjusted to be below impact causing levels to minimize the risk of future impacts. A calibration cycle need only be performed at intervals, such as once every 1,000 to 10,000 pulses or at periodic time intervals.

A still further way to address the needs discussed above and minimize the potential for damage to the rod or other components should impact occur is to protect the ends of the magnetostrictive rod or portions thereof with end caps. This substantially alleviates fractures and chips occurring at the end faces. These end caps may be bonded to the rod with epoxy. Each end cap distributes its load across a face of the rod through the compliant epoxy. The end caps are preferably made from a ferromagnetic material to minimize flux divergence at the rod ends. The material is also preferably hardenable for good wear characteristics. Since nothing is perfect, there will always be a small amount of misalignment between faces. Thus, a further refinement is to fabricate one or both end caps with a curve, such as a spherical radius preferably equal to the total length of the end caps plus the magnetostrictive rod. Each spherical end permits other fabrication tolerances to be lowered, thus permitting cost comparison between fabrication processes.

Additionally, another embodiment of the present invention may addresses the needs discussed above by separating the rod into one or more separate lengths, pieces or sections. This helps to minimize the potential for the rod or rods to experience resonance related fracture. Preferably, the length of the first section in relation to the second section is determined such that the point of interaction between the sections suppresses resonance of a standing elastic wave.

These and other objects, features or advantages of the present invention will become apparent from the specification and claims.

BRIEF DESCRIPTION OF THE DRAWINGS

Numerous other objects, features, and advantages should become apparent upon a reading of the following detailed description taken in conjunction with the accompanying drawings, in which:

FIGS. 2-6 are cross sectional views of various embodiments of the rod of the present invention.

DETAILED DESCRIPTION OF THE PREFERRED EMBODIMENTS

Figure 1:
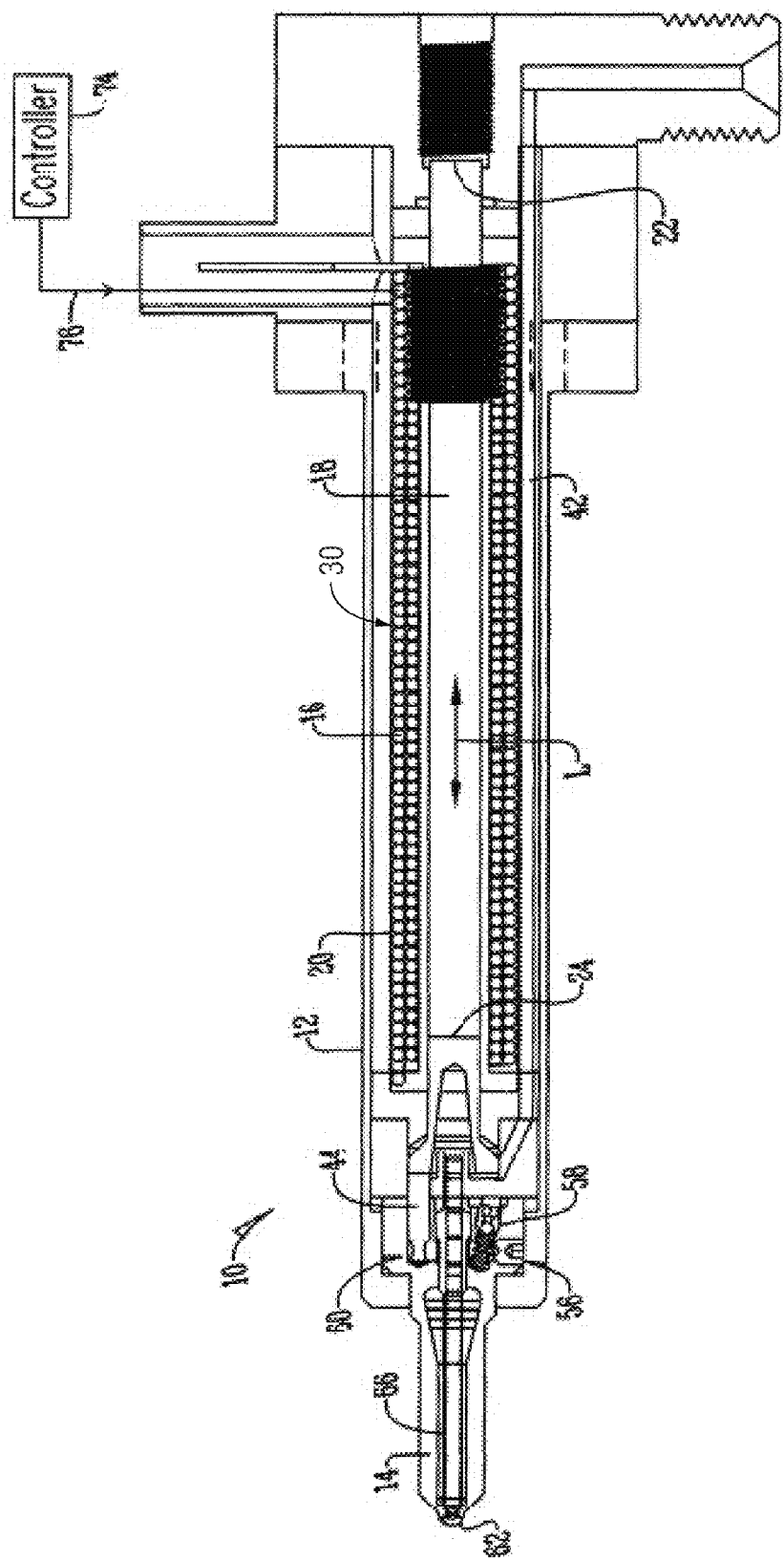
FIG. 1 is cross sectional view of a magnetostrictive actuator as employed in a fuel injector.

Hereinafter, the present invention is described in detail based on one or more embodiments shown in the drawings, though the present invention is not limited to the embodiments Now, referring to the Figures, Referring to the figures, an apparatus for injecting fuel 10 (also referred to herein as a fuel injector) comprises a housing 12 including a nozzle 14 supported therein and protruding from one end of the housing 12. Also provided in the housing 12 is an actuator 30 including a helically wound solenoid coil 16 concentrically surrounding a magnetostrictive material 18 and a magnetic return path circuit 20 is concentric to the helically wound solenoid coil 16 in magnetic communication with the solid magnetostrictive material 18.

In one embodiment, the magnetostrictive material 18 is provided as a solid magnetostrictive material 18, which in a preferred embodiment, is comprised of terbium alloy, having a first end 22 and a second end 24 that are substantially parallel to each other and substantially perpendicular to a favored direction of magnetostrictive response, L. Furthermore, the solenoid coil 16, located concentric with the magnetostrictive material 18 and coaxial to the favored direction of magnetoelastic response L is adapted to excite the magnetostrictive material 18 into mechanical motion.

Also provided is a piston 44 driven by the actuator 30. Piston 44 has a first side on a first end of piston 44 which directly adjacent to and abutting the second end 24 such that piston 44 is in operative disposition and engagement with magnetostrictive material or rod 18. Piston 44 further has a second side on a second end of piston 44 adjacent a hydraulic chamber containing a closed fuel volume such that the second side on the second end of piston 44 forms a wall of the hydraulic chamber in fluid communication with the pressure source to form a closed, pressurized volume via the flow restrictor 56, all of which forming a fuel pressure mechanism 60, as hydraulic chamber is also in fluid communication with a flow restrictor 56. In one embodiment, flow restrictor includes check valve 58.

Alternatively, flow restrictor 56 includes a serpentine passage comprised of serpentine lines for high flow resistance but also provided with passageways that will not become plugged by any contaminant particles. Furthermore, fuel pressure mechanism 60 is associated with the magnetostrictive material or rod 18 and is adapted to using fuel pressure to subject the magnetostrictive material or rod 18 to a static compressive stress magnitude of no less than fifteen megapascals along the favored direction of magnetostrictive response L with an effective stiffness no greater than one-fourth the stiffness of the magnetostrictive element 18 without the magnetostrictive material 18 being subjected to a magnetic field by the mechanism 60.

Nozzle 14 extends from an end of the housing to a tip 62 having nozzle ports. Nozzle 14 also includes a needle 66, which in a preferred embodiment is hollow. Needle 66 is disposed and moves axially within the interior of the nozzle 14. Nozzle 14 also includes an injection valve pressure chamber adjacent the exterior surface of the needle 66 in fluid communication with fuel pressure line such that axial movement and opening of the needle 66 allows pressurized fluid to flow through the ports into the combustion chamber. Specifically, needle 66 extends within and is movably and axially displaced within the interior of the nozzle 14 from the tip 62 of the nozzle 14 to open and close the nozzle ports in a closed position, into the housing 12 to interact and fluidly communicate with the fuel pressure mechanism 60 to form a fuel control valve element which is located coaxial to the favored direction of magnetoelastic response L of the magnetostrictive material or rod 18 opening inwardly such that as the transducer drives the piston 44, displaced closed volume fuel modulates the needle 66 position. In an alternate embodiment, a control valve stem is attached directly to the piston 44, and in such an embodiment, it is preferred to provide additional means of thermal compensation.

Furthermore, a controller 74 is provided in electronic communication with the solenoid coil 16 and magnetostrictive material 18, wherein the controller 74 sends signals through a circuit 76, including but not limited to current signals, to the solenoid coil 16 and magnetostrictive material 18 to actuate the solenoid coil 16 and magnetostrictive material 18 and produce electrical waveforms, rotate magnetic domains into alignment, and lessen the inhibition on magnetic domain rotation as described herein. The controller 74 also receives signals for processing as described herein.

The actuating device 30 includes a housing 12 as shown in FIGS. 1 and 2. Disposed within the housing 12 is an electromechanical transducer including a helically wound solenoid coil 16 concentrically wound at least once and preferably surrounding a magnetostrictive material 18 and a circuit 76 that is concentric to the helically wound solenoid coil 16 in magnetic communication with the magnetostrictive material or rod 18. Preferably, the magnetostrictive material 18 is made of terbium alloy. The solenoid coil 16, preferably located concentric with the magnetostrictive material or rod 18 and coaxial to the favored direction of magnetoelastic response L is adapted to excite the magnetostrictive material or rod 18 into mechanical motion.

An alternating signal is applied to the solenoid 16, to provide an excitation signal within the solenoid coil 16 having a main current signal with a superposed alternating signal approximately the width of the hysteresis loop of magnetostrictive material 18, which decreases the inhibition on magnetic domain rotation.

Initially, an initial current circulates through the solenoid 16 in one direction providing a magnetic field of one polarity which causes a corresponding magnetostrictive expansion. While quick expansion is important, quick retraction is also important. To collapse the magnetic field quickly and return the actuator to its rest position as quickly as possible, a closing pulse of sufficient magnitude is applied. When the initial current for expansion is applied, a voltage opposite the initial current is also applied. As the expansion current decreases toward zero, the opposite expansion current begins to circulate in the reverse direction causing the actuator to return to its expansion rest position with minimum rest time in between expansion and retraction. Thus, the time for a cycle of expansion, to full retraction, and back to expansion is minimized by maintaining a constant reverse voltage.

To prepare the actuator 30 to operate at cold temperatures, such as 0 to −40° C., eddy currents are induced in the rod by supplying the solenoid coil 16 with an alternating current. The eddy currents dissipate heat directly within the body of the magnetostrictive alloy, which is an electrical conductor, and avoid the need to heat the rod through resistance heating using a direct current flow through the solenoid coil 16 which is unacceptably long because the heat must diffuse and conduct itself through the coil, and then into the magnetostrictive alloy. To minimize any delay, and quickly reach a temperature at which an injector will operate well enough to permit engine starting after being cold soaked at a low temperature, a sufficient magnitude and frequency to be applied to the solenoid are chosen.

To calibrate the actuator 30 to limit actuator impact, the actuator is calibrated. To calibrate the actuator 30, energy output that is generated by the reciprocity of the actuator is fed back to a controller 74. The controller identifies distortions in the electrical input signal which are indicated by a sudden change in the slope of current and/or voltage that occur at impact. Based on the identification of distortions in the electrical energy feedback, the controller sets a maximum pulse width and other control parameters. This limits and reduces impact of the actuator 30, which varies over time due to wear, and varies from one actuator to another. The energy output feedback is preferably provided intermittently at predetermined time intervals.

There are at least two ways to prevent rod fracture.

1. Rod natural frequency is proportional to length. Dividing a single rod into separate, preferably different lengths helps suppress standing waves.

2. The alloy tensile strength may be increased. At the present state of the art, increasing tensile strength may diminish other highly desirable alloy properties.

As shown in FIGS. 2-6, to further limit wear and breakage of the actuator 30, the magnetostrictive rod 18 is comprised of a first section 26 and a second section 28 that fit together at one end. Additional sections can be used if desired. The length of the first section 26 in relation to the second section 28 is determined such that the point of connection 40 between the sections 26 and 28 suppresses a standing elastic wave that is naturally created under certain operating conditions of the actuator 10. Thus, by segmenting the rod 18 into sections of unequal length, the sections become uneven multipliers of the operational natural frequency.

An additional measure, to guard against fracture of the rod 18, is to bond an end cap 32 to each end of the rod 16. Preferably, the end caps 32 are made of a hardened, ferromagnetic alloy that is bonded with epoxy. The epoxy also bonds the outside diameter edge of the cap 32 to prevent chipping. The end caps 32 distribute the load across the face of the rod 18 through the compliant epoxy used for bonding.

Figures 5, 6:
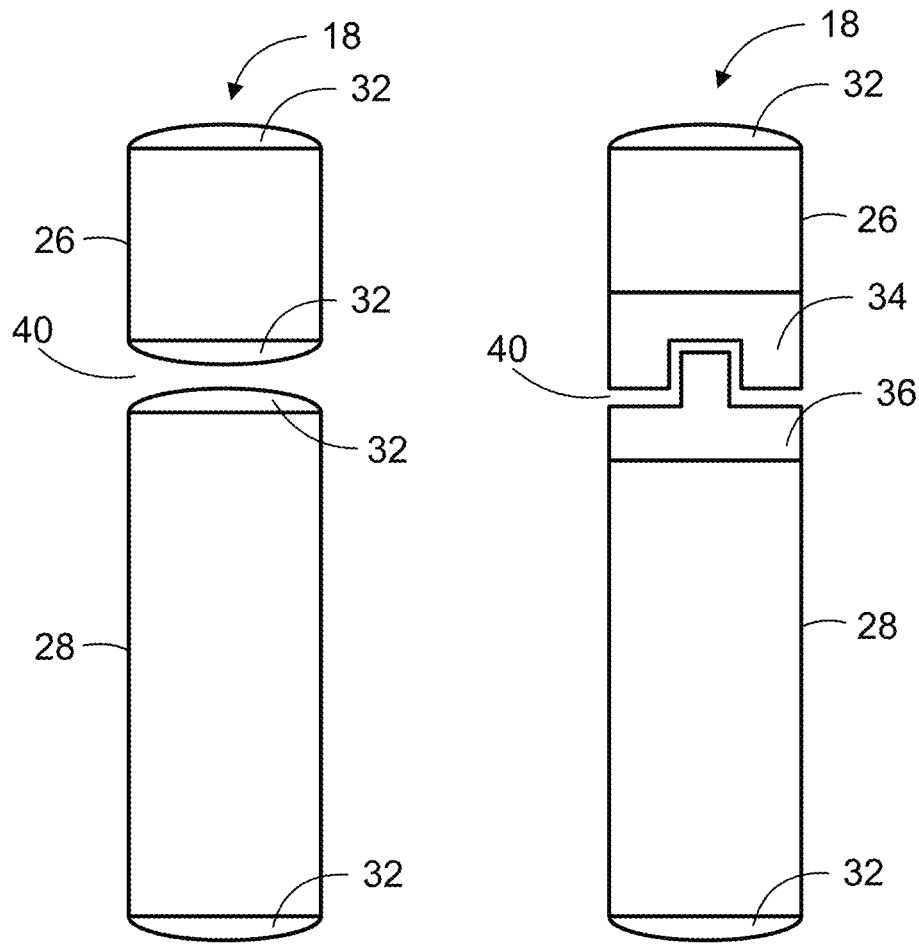

Additionally, one or both of the ends of the rod 18 are hardened with or without a spherical radius equal to the total length of the rod 18. The spherical end permits fabrication tolerances to be lowered reducing costs. Each section 26, 28 may also include end caps 32 as shown in FIGS. 5 and 6. As shown in FIG. 6, the end caps 32 between sections 26 and 28 may include structural elements 34 and 36 designed to allow for a gap between the end caps 32 of sections 26 and 28 while minimizing the potential for non-axial movement of the sections 26 and 28 relative to one another.

Finally, to further reduce the possibility of fracture to the rod 18, a bias spring may be used to reduce tensile stress within the rod 18. The spring, in the shape of a thin tube, surrounds the coil 16. The stiffness of the spring is controlled by cutting out voids in the tube, which simultaneously disrupts the flow of eddy currents. The spring, preferably made of ferromagnetic material provides a minimum compressive preload to prevent tensile failure induced by operation.

Figure 7:
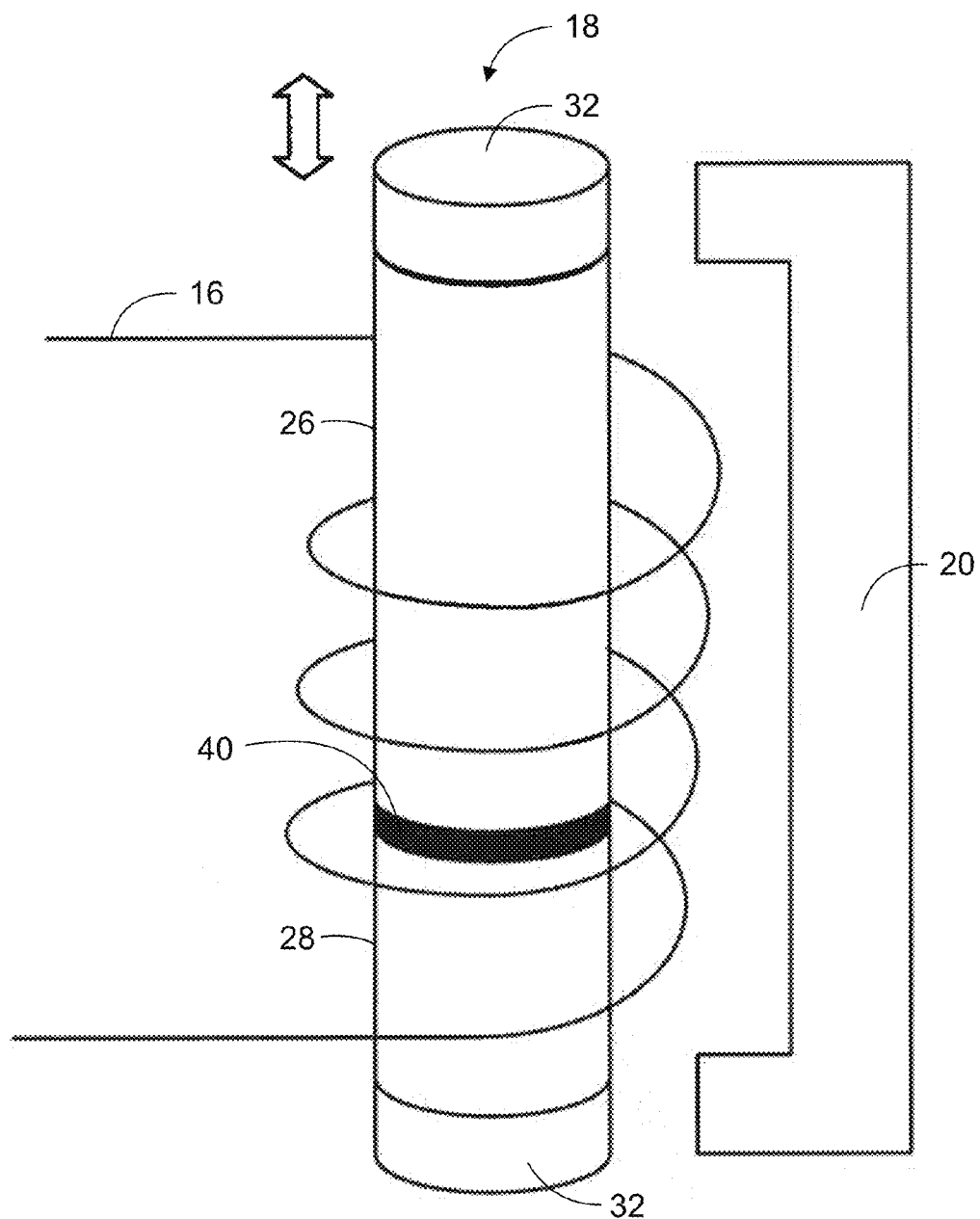
FIG. 7 is a schematic view of the actuator of the present invention.

Referring to FIG. 7 for the preferred embodiment of the magnetostrictive actuator of the present invention. While this actuator 30 may be used in a fuel injector 10 as discussed above, other applications are also possible.

The magnetostrictive actuator 30 employs a rare earth alloy rod assembly 18 with its grain oriented in the axial direction, an energizing helical winding or solenoid coil 16 concentric to the rod assembly 18, and a magnetic flux return path 20. The actuator 30 preferably contains zero magnetic field at zero current.

The segmented rod assembly 18 may be formed of two or more segments or sections 26 and 28 as discussed above, both consisting of a rare earth/transition metal magnetostrictive alloy, a boundary 40 between separate segments, and ferromagnetic end caps 32. The rare earth/transition metal magnetostrictive alloy rod 18 may be formed of a grain-oriented polycrystalline rare earth/transition metal material of the formula $Tb_xDy_{1-x}Fe_{2-w}$ wherein $0.20<=x<=1.00$ and $0<=w<=0.20$. The grains of the material have their common principal axes substantially pointed along the growth axis of the material which is within 10° of the $\lambda_{111}$ axis.

As each segment 26, 28 has its grain oriented in the axial direction, each segment 26, 28 is provided as a solid magnetostrictive material with a favored direction of magnetostrictive response formed into a shape with ends that are substantially parallel to each other and substantially perpendicular to the favored direction of magnetostrictive response.

The shape of each segment 26, 28 may be a cylinder, ellipsoid, parallelepiped, prismatic, other similar shapes, or other suitable shapes. Each segment 26, 28 may have a transverse dimension perpendicular to the direction of magnetostrictive response substantially smaller than one quarter wavelength at the electromechanical resonant frequency of the apparatus. Each segment 26, 28 within the segmented rod assembly 18 may have a length in the direction of magnetostrictive response of no greater than one quarter wavelength at the electromechanical resonant frequency of the apparatus.

A boundary exists between each of the end caps 32 and the rod 18. The end caps 32 may secured to the rod 18 or segments thereof with a material with a stiffness substantially less than the magnetostrictive alloy such as a compliant bonding agent. The end caps protect the rod 18 during impact and minimize injector wear and wear on the rod 18. Injector wear is minimized as well because the potential impact on other components is lessened.

As is understood, lines of magnetic force have no beginning and no end. To minimize the energy required to generate a field strength sufficient to excite the segmented rod assembly 18, a path 20 of preferably ferromagnetic material is provided to guide the lines of magnetic force around the outside of the coil 16 from one end of the segmented rod assembly 18 to the other.

Operating Description

Upon application of a current ±I of either polarity to the coil 16, a sheet of electrons circulating in one direction or the other is established. As is known, the circulating sheet of electrons results in a magnetic field ±H, the polarity depending on the direction of circulation. This field generates magnetic lines of force that cross into the segmented rod assembly 18 with a corresponding magnetic flux density ±B, the magnitude of which depends upon the magnetic permeability of the entire magnetic circuit, including segmented rod assembly 18. Lines of flux close back on themselves through the flux return path 20 which, together with segmented rod assembly 18, forms the entire magnetic circuit.

Continuous control of the current into coil 16 continuously controls the axial expansion or contraction of the segmented rod assembly 18. The rate at which current increases or decreases and its maximum magnitude are both converted by segmented rod assembly 18 into a corresponding mechanical expansion waveform.

At position $x_1$, expanding rod assembly 18 collides with an obstacle. For example, if rod assembly 18 is directly driving the needle in a diesel fuel injector, that needle may reach the limit of its travel before rod assembly 18 has reached its maximum possible expansion. For a second example, a different, purpose-built obstacle can be fabricated into the actuator as part of the calibration mechanism, sparing the valve impact.

As is well known, energy is always conserved. At impact, the kinetic energy of the moving component excites elastic waves in all components involved in the collision. Within rod assembly 18, an elastic wave initially travels in the direction opposite to the motion it had at impact. The velocity of the wave is controlled by the density and elastic modulus of the rare earth/transition metal alloy.

As the elastic wave travels the length of rod assembly 18, it locally alters the state of both stress and strain within the alloy. Because the alloy is comprised of magnetic domains each with local permeability, the passage of the elastic wave slightly rotates those domains, locally altering permeability. Altering permeability alters the inductance of the magnetostrictive actuator.

Figure 9:
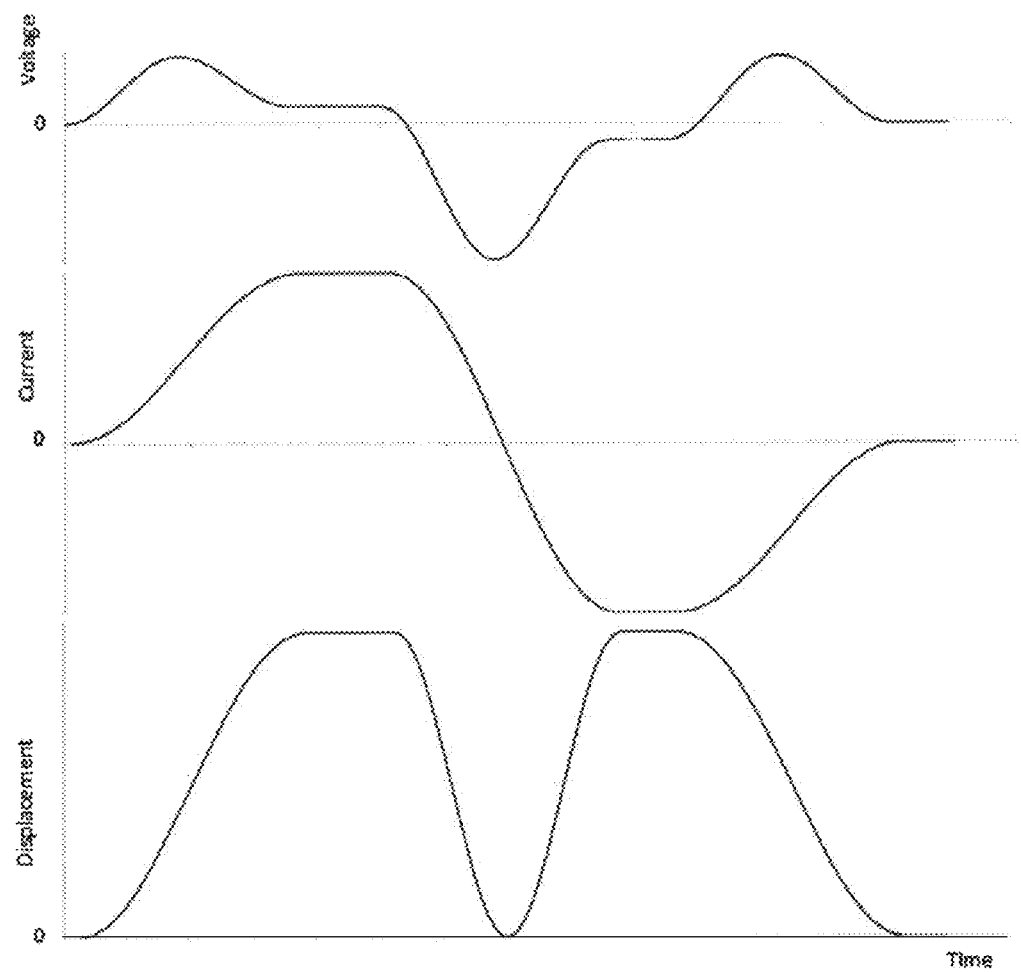
FIG. 9 is a graph showing the simultaneous traces of voltage, current, and lift that a magnetostrictive actuator would display at impact.

Thus, as shown in FIG. 9, the presence of an elastic wave can be detected in the controller 74 by sudden changes in up to four parameters: A) the voltage applied across solenoid coil 16, B) the time rate of change of the applied voltage across solenoid coil 16, C) the current through solenoid coil 16, and/or D) the time rate of change of the current through solenoid coil 16. Thus, if an impact is thus detected, the controller 74 can adjust the current, voltage or time rate of change of the current or voltage to minimize potential for additional impacts.

Optionally, an elastic wave can be detected by a separate search coil comprised of many fine turns. The search coil generates a voltage output when magnetic lines of force cut across it. The search coil voltage or the time rate of change of voltage will exhibit the same sudden change at impact as can be observed on energizing coil 16.

The shortest possible time delay between expansion strokes of magnetostrictive actuator 30 is made possible by applying and maintaining a reverse voltage to the coil such that current circulating in one direction is first stopped and then circulates in the other direction. Limits on voltage and the rate of change of that voltage are not imposed by the rare earth/transition metal alloy.

Refer to FIGS. 4 and 13 of U.S. Pat. No. 6,758,408 for graphs showing how magnetostriction declines rapidly below 0° C., for the commercially available magnetostrictive alloy. In an engine, the actuator must operate after cold soaking at −40° C. Glow plugs supply resistive heat to help start cold engines. Similarly, a magnetostrictive actuator can be heated by resistance to current flow through its solenoid coil. However, the time required to heat the alloy rod will be long because the heat must diffuse from the coil into the rod.

One of the key characteristics of the alloy is that it is also an electrical conductor. As is well known, the time rate of change of a magnetic field across an electrical conductor causes currents, dubbed eddy currents, to curl around that changing field. Since the alloy that comprises rod assembly 18 has an electrical resistivity, the eddy currents dissipate power, which appears as heat within the rod itself. Thus, the time rate of change of the alternating current applied to coil 16 controls the rate at which the alloy will warm up to its operating temperature range.

Therefore, a direct method of heating it is to cause it to resist internal eddy currents. The time rate of change of a magnetic field is supplied by energizing solenoid coil 16 with a current that has the desired time rate of change. Thus, the energy needed to heat the rod bypasses the time delay caused by diffusion. The magnitude and time rate of change of the current applied to the coil are chosen to minimize delay.

If the magnetostrictive device is to be operated as a sensor instead of an actuator, using eddy currents to warm it up to its best operating temperature may be applicable.

Figure 8:
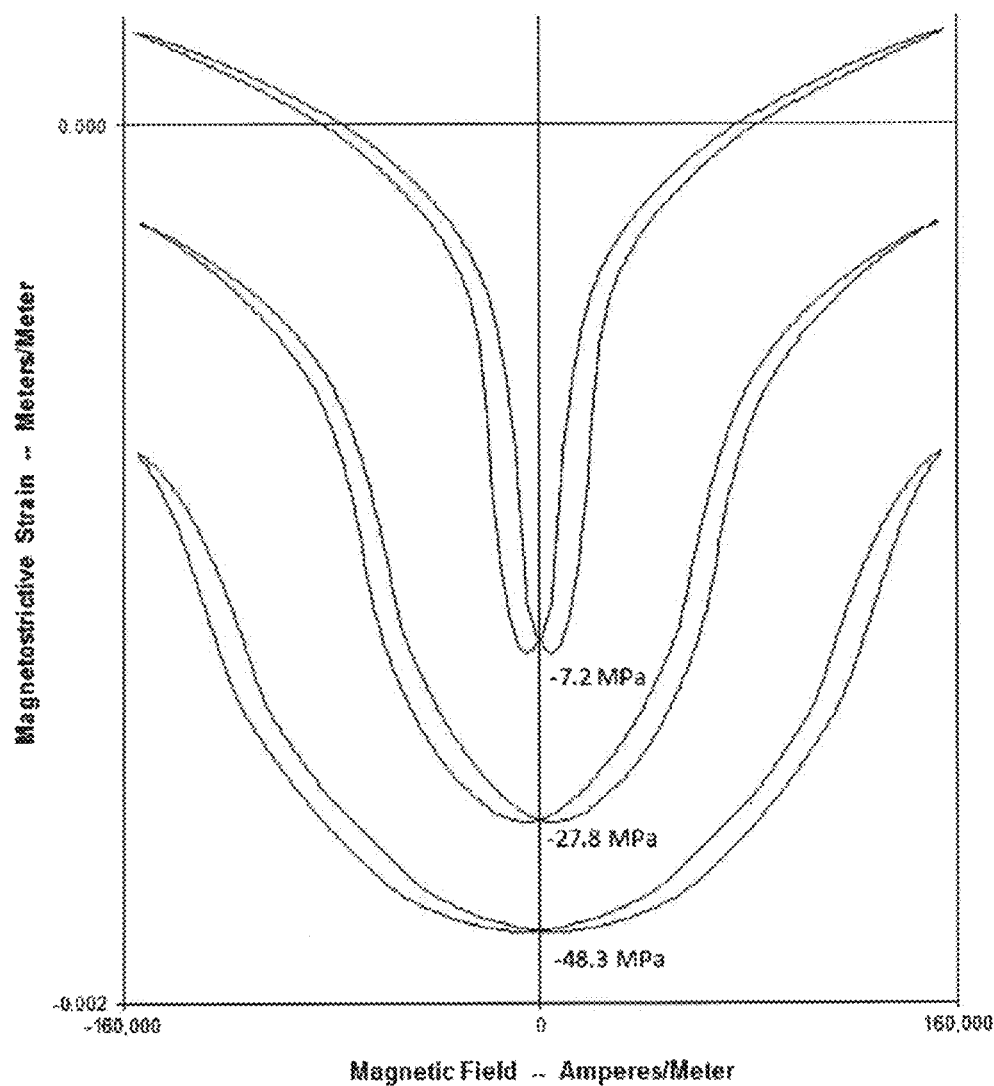
FIG. 8 is a graph showing the simultaneous traces of voltage, current, and lift that a magnetostrictive actuator would display for minimum time delay between separate injections.

Refer to FIG. 8. At rest, current is zero. A voltage waveform of one polarity is applied at an initial time $t_0$, inducing a current waveform of matching polarity to flow through coil 16. The current within coil 16 may be thought of as a sheet of electrons circulating around the axis of coil 16. As is known, the circulating sheet of electrons establishes a magnetic field of matching polarity. This field generates magnetic lines of force that cross into rod assembly 18 with a corresponding magnetic flux density of matching polarity, the magnitude of which depends upon the magnetic permeability of the entire magnetic circuit, including rod assembly 18. Lines of flux close back on themselves through the flux return path 20 which, together with rod assembly 18, forms the entire magnetic circuit. The magnetic flux waveform within rod assembly 18, regardless of polarity, causes a corresponding axial expansion waveform.

At time $t_1$, a voltage of polarity opposite to the established flow of current is applied. In response, the current decreases at some rate toward zero. At zero current there is zero field and therefore rod assembly 18 has zero expansion. At zero current, with the reversed voltage still applied, current begins to circulate in the reverse direction, inducing a reversed magnetic field. In response, rod assembly 18 begins to expand again. Thus, the time for a cycle of expansion-full retraction-expansion is minimized simply by maintaining a constant reverse voltage. The electrical source of voltage and current is correspondingly simple since there is no need to detect zero voltage or current nor is there a need to observe limits.

The features and advantages described in the specification are not all inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

Those of ordinary skill in the art will realize that the following description of the present invention is illustrative only and not in any way limiting. Other embodiments of the invention will readily suggest themselves to such skilled persons.

The embodiment disclosed herein was chosen and described in order best to explain the principles of the invention and its practical application, thereby to enable others skilled in the art best to utilize the invention in various embodiments and with various modifications as are suited to the particular use contemplated therefore. It is intended that the scope of the invention be defined by the claims appended hereto, when interpreted in accordance with the full breadth to which they are legally and equitably entitled.

What is claimed is:

1. A magnetostrictive actuator comprising:
a rod assembly having a length defined between opposite ends each having a face substantially perpendicular to a direction of magnetostrictive response, and a plurality of segments each comprised of magnetostrictive material;
an end cap comprised of a hardened material, secured at each of the opposite ends of the rod assembly to one of the plurality of segments, and configured to distribute a load across the face of each of the opposite ends of the rod assembly; and
wherein at least two of the plurality of segments of the rod assembly are of different lengths so as to minimize or suppress a standing wave.

2. The magnetostrictive actuator of claim 1 wherein the plurality of segments are abutting.

3. The magnetostrictive actuator of claim 1 wherein the hardened material is ferromagnetic and the end cap is secured at each of the opposite ends of the rod assembly with a bonding material.

4. The magnetostrictive actuator of claim 3 wherein the bonding material is a compliant polymer.

5. The magnetostrictive actuator of claim 1 further comprising a point of connection comprising an interface between the at least two of the plurality of segments of different lengths, wherein the point of connection minimizes or suppresses the standing wave.

6. The magnetostrictive actuator of claim 5 wherein the point of connection comprises:
(a) adjacent end caps each associated with one of the at least two of the plurality of segments; or
(b) adjacent structural elements each associated with one of the at least two of the plurality of segments.

7. The magnetostrictive actuator of claim 1 wherein an obstacle is present within the displacement range of the actuator.

8. The magnetostrictive actuator of claim 7 wherein the obstacle is a valve element that is part of a fuel injector.

9. The magnetostrictive actuator of claim 1 wherein each of the plurality of segments has a length in the direction of magnetostrictive response no greater than one quarter wavelength at an electromechanical resonant frequency of the actuator.

10. A magnetostrictive actuator comprising:
a rod assembly, said rod assembly comprising a magnetostrictive material having a length defined between a first end and a second end;
at least one end cap secured to the first end of the magnetostrictive material wherein said end caps are a hardened material; and
wherein the end cap has an outer end with a spherical radius equal to the length of the rod assembly.

* * * * *